United States Patent [19]

Parrillo

[11] Patent Number: 4,951,100
[45] Date of Patent: Aug. 21, 1990

[54] HOT ELECTRON COLLECTOR FOR A LDD TRANSISTOR

[75] Inventor: Louis C. Parrillo, Austin, Tex.

[73] Assignee: Motorola, Inc., Schaumburg, Ill.

[21] Appl. No.: 374,703

[22] Filed: Jul. 3, 1989

[51] Int. Cl.⁵ ............................................. H01L 29/78
[52] U.S. Cl. ................................. 357/233; 357/23.12; 357/53; 357/59
[58] Field of Search .................. 357/23.3, 23.5, 23.12, 357/53, 23.4, 59 E, 59 G, 59 J; 437/44, 35

[56] References Cited

U.S. PATENT DOCUMENTS

| | | | |
|---|---|---|---|
| 4,754,320 | 6/1988 | Mizutani et al. | 357/23.3 |
| 4,769,686 | 9/1988 | Horiuchi et al. | 357/23.3 |
| 4,808,544 | 2/1989 | Matsui | 357/23.5 |
| 4,843,023 | 6/1989 | Chiu et al. | 437/34 |

FOREIGN PATENT DOCUMENTS

| | | | |
|---|---|---|---|
| 59-231864 | 12/1984 | Japan | 357/23.3 |
| 62-217665 | 9/1987 | Japan | 357/23.3 |
| 63-296278 | 12/1988 | Japan | 357/233 |

Primary Examiner—William D. Larkins
Assistant Examiner—Donald L. Monin
Attorney, Agent, or Firm—James L. Clingan, Jr.

[57] ABSTRACT

A lightly-doped drain (LDD) structure has conductive shield overlying the lightly-doped drain and source portions to collect and/or remove hot carriers which can otherwise cause instabilities such as gain degradation and threshold voltage shifts in short-channel MOS devices. The hot carriers eventually deteriorate the performance of the transistor to the point where the transistor provides insufficient performance. Thus, the lifetime of a transistor is affected by the degradation caused by the formation of hot carriers. The lifetime is increased by collecting the hot carriers in the conductive material over the lightly-doped source and drain.

14 Claims, 4 Drawing Sheets

HOT ELECTRON COLLECTOR FOR A LDD TRANSISTOR

FIELD OF THE INVENTION

The invention relates MOS transistor device structures, and more particularly, to device structures of MOS transistors which have a lightly-doped drain (LDD).

BACKGROUND OF THE INVENTION

Lightly-doped drain (LDD) transistors have a lightly doped portion at both ends of the channel with heavily-doped portions spaced from the channel to form contacts. In the use of LDD transistors there has been discovered a problem created by hot carriers that result from high electric fields. Although attenuated in LDD transistors, hot carriers still cause a particular problem for the lightly-doped sources and drains of the LDD structure. Hot electrons get into the oxide above the lightly-doped regions and tend to deplete the mobile carriers from the surface of these lightly-doped regions. This causes an increase in the source and/or drain resistance which results in degradation in the gain of the transistor. This degradation is less if there are more mobile carriers which can be obtained by increasing the doping level of the lightly-doped source and drain. The increased doping level, however, also increases the internal electric field and the number of generated hot carriers, which thus increases the tendency of the hot carriers to drive the mobile carriers away from the surface of the lightly-doped regions. There has been determined an implant dosage of about $5 \times 10^{13}$ of phosphorus for N channel transistors which has been found to be the optimum dosage for minimizing this problem. The problem, however, still exists even at that dosage. Additionally, the preferred dosage for other characteristics, such as gate-aided and avalanche breakdown, is less than that. Thus, the hot electrons and holes generated by internal electric fields reduce the useful lifetime of the transistor.

One solution was disclosed in an article, "A New LDD Transistor With Inverse T-Gate Structure," Tial-Yuan Huang et al, *IEEE Electron Device Letters*, Vol. EDL-8, No. 4, Apr. 1987. In that case the structure involved a T-shaped polysilicon gate which had a thick portion over the channel and a thin portion which was implanted through by the first implant to form the lightly-doped portion of the drain. Sidewall spacers were formed on the thick portion of the polysilicon gate for the mask for the second, heavy implant. This, however, resulted in close proximity of the gate to the heavily doped portion of the source/drain. There was then present excessive capacitance between the gate and the heavily doped source/drain regions. Such excessive capacitance is deleterious to circuit performance.

SUMMARY OF THE INVENTION

Accordingly, it is an object of the present invention to provide an improved MOS transistor structure.

It is another object of the present invention to provide a MOS transistor with an improved LDD structure.

In carrying out these and other objects of the invention, there is provided, in one form, a transistor formed in an active region of a substrate, having a first insulator layer, a gate, a second insulator layer, a lightly-doped source region, a lightly-doped drain region, a channel region, a first heavily-doped region, a second heavily-doped region, a first conductive strip, and a second conductive strip. The first insulator layer is on the active region. The gate overlies the first insulator layer at an intermediate portion of the active region and leaves a first portion and a second portion of the active region uncovered by the gate. The gate has a first side and a second side. The first and second sides are aligned with the first and second portions, respectively, of the active region. The second insulator layer coats the first and second sides of the gate. The lightly-doped source region is in the first portion of the active region and aligned substantially with the first side of the gate. The lightly-doped drain region is in the second portion of the active region aligned substantially with the second side of the gate. The channel region is in the active region, under the gate, and between the lightly-doped source region and the lightly-doped drain region. The first heavily-doped region is in the first portion of the active region, offset from the first side of the gate, and adjoining the lightly-doped source region. The second heavily-doped region is in the second portion of the active region, is offset from the second side of the polysilicon gate, and adjoins the lightly-doped drain region. The first conductive strip adjoins the insulator coating on the first side of the gate and is over at least a portion of the lightly-doped source. The second conductive strip adjoins the insulator coating on the second side of the gate and is over at least a portion of the lightly-doped source.

DETAILED DESCRIPTION OF THE INVENTION

Figure 1:
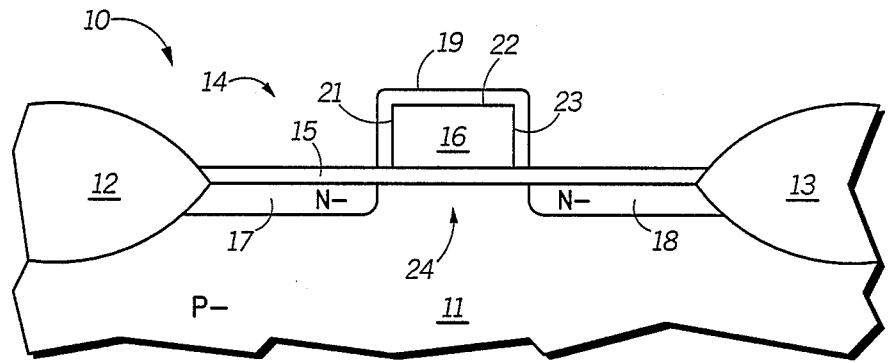
FIG. 1 is a cross-section of a portion of an integrated circuit at a stage in processing according to the prior art.

Shown in FIG. 1 is a cross-section of a portion 10 of an integrated circuit formed in a P− substrate 11 at a stage in processing according to the prior art comprising a field oxide region 12, a field oxide region 13, an active region 14 therebetween, an oxide layer 15 over active region 14, a polysilicon gate 16, a source region 17 which is lightly-doped to N−, a drain region 18 which is lightly doped to N−, and a reoxidation layer 19 coating polysilicon gate 16. The structure of portion 10 shown in FIG. 1 is formed in conventional fashion by forming field oxide regions 12 and 13, growing oxide layer 15 in active region 14, forming a polysilicon layer over oxide layer 15 which is etched to form gate 16, implanting source and drain regions 17 and 18 to N−, and reoxidizing gate 16 to form reoxidation layer 19. Polysilicon gate 16 has a left side 21, a top side 22, and a right side 23 which are coated by reoxidation layer 19. Polysilicon gate 16 is formed intermediate active region 14 so that source region 17 and drain region 18 are uncovered by gate 16. A channel region 24 is in substrate 11, under gate 16, and between source region 17 and drain region 18. Portion 10 shown in FIG. 1 could be a portion of a well in a CMOS process.

Figure 2:
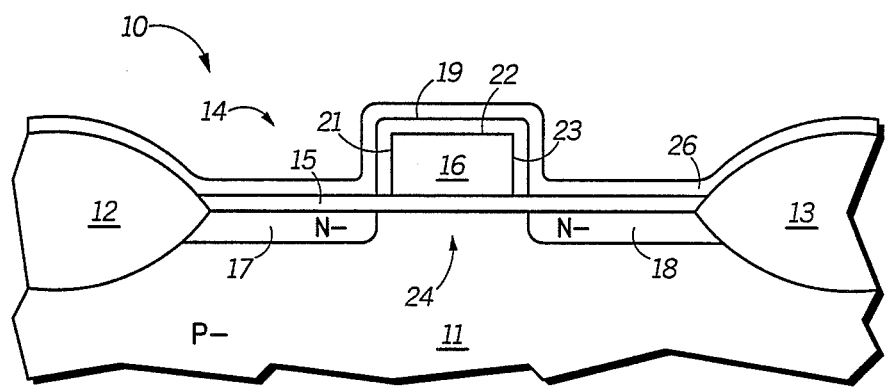
FIG. 2 is a cross-section of the portion of the integrated circuit of FIG. 1 at a subsequent stage in processing according to a preferred embodiment of the invention.
Figure 3:
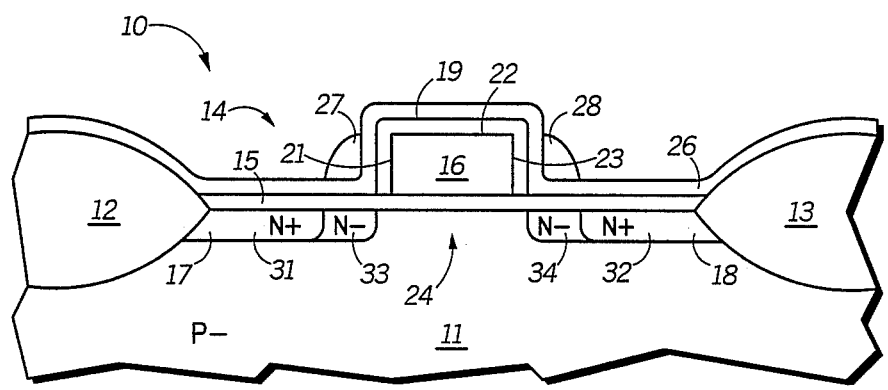
FIG. 3 is a cross-section of the portion of the integrated circuit of FIG. 1 at a stage in processing subsequent to that shown in FIG. 2 according to the preferred embodiment of the invention.

Shown in FIG. 2 is portion 10 with a relatively thin layer of polysilicon 26 deposited thereover. Polysilicon is used in one embodiment of the invention, but another conductive material could also be used. Polysilicon is actually a semiconductor, but in most applications it is conductive in nature. As used herein, conductive material includes polysilicon. Polysilicon layer 26 is conformal in nature so that left side 21, top side 22, and right side 23 of polysilicon gate 16 are coated by polysilicon layer 26 as well as source region 17 and drain region 18. After polysilicon layer 26 has been deposited, sidewall spacers 27 and 28 are formed as shown in FIG. 3. Sidewall spacers 27 and 28 are adjacent to sides 21 and 23, respectively, of polysilicon gate 16. After formation of sidewall spacers 27 and 28, an N+ implant is performed to form heavily-doped region 31 in source region 17 and heavily-doped region 18 in drain region 18. Such spacer material may be a deposited oxide for example. This leaves a lightly-doped region 33 in source region 17 and a lightly-doped region 34 in drain region 18. Sidewall spacer 21 is located over region 33 and acts as a mask during the N+ implant so that region 33 is not doped during the N+ implant. Gate 16 acts as a mask during the N+ implant so that channel 24 is not doped by the N+ implant. Sidewall spacer 28 is located over region 34 and acts as a mask during the N+ implant so that region 34 is not doped during the N+ implant. Thus, portions 33 and 34 are substantially aligned with left and right sides 21 and 23, respectively, and adjoin N+ regions 31 and 32, respectively. The N+ implant as shown is the same depth as that of the N− implant but either implant could be deeper than the other.

Figure 4:
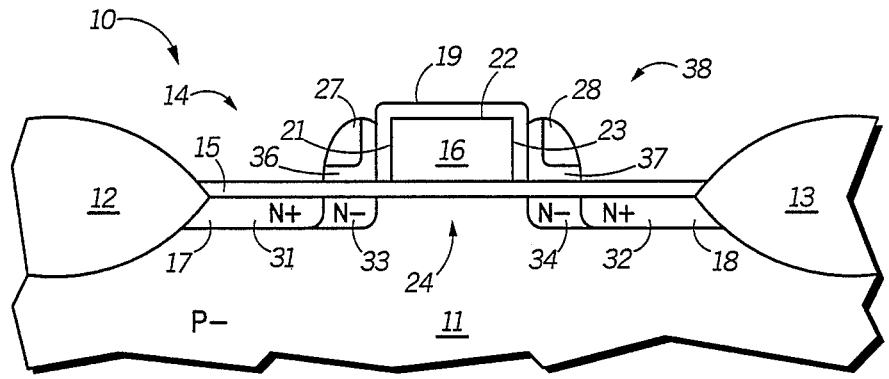
FIG. 4 is a cross-section of the portion of the integrated circuit of FIG. 1 at a stage in processing subsequent to that shown in FIG. 3 according to the preferred embodiment of the invention.

After the N+ implant, an etch of polysilicon layer 26 is performed using sidewall spacers 27 and 28 and polysilicon gate 16 as a mask. Shown in FIG. 4 is portion 10 after this etch of polysilicon layer 26. After this etch there is a portion 36 of polysilicon under sidewall spacer 27 and a portion 37 of polysilicon under sidewall spacer 37. Portion 36 also extends along left side 21 of polysilicon gate 16. Similarly, portion 37 extends along right side 23 of gate 16. A transistor 38 is formed of source and drain regions 33 and 34, respectively, and gate 16. Portions 36 and 37 are in close proximity to the left and right bottom corners, respectively, of gate 16 of transistor 38 where the highest electric field strength occurs during normal operation of transistor 38. This highest field strength location is at or near the location where hot electrons are most generated. Thus, portions 36 and 37 located over portions 33 and 34 are in position to collect these hot electrons instead of having them become trapped in oxide 15 at the interface of channel 24 or in thicker oxide 28 which lies above portion 37. Portions 36 and 37 can be considered shields. The collection of these electrons prevents them from adversely affecting the mobile carriers in drain region 34. The electrons that do remain in thin oxide 15 between shield portion 37 and N− portion 34 are imaged on shield portion 37. Shield portion 37 thus has a positive charge accumulation near the electrons trapped in thin oxide 15. Thus, the tendency of these trapped electrons to deplete N− portion 34 is reduced by the positive charge that is imaged onto shield portion 37. The presence of shield portions 36 and 37 for the transistor formed as portion 10 increases lifetime of the transistor and allows for the reduction in the doping level of drain region 34.

Figure 5:
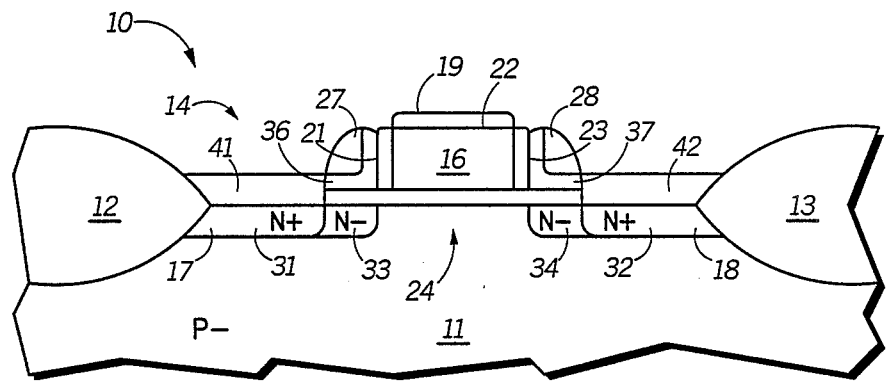
FIG. 5 is a cross-section of the portion of the integrated circuit of FIG. 1 at a stage in processing subsequent to that shown in FIG. 4 according to an optional embodiment of the invention.

Portion 36 and region 31 can be connected together, and portion 37 and region 32 can be connected together so as to avoid accumulating electrons in shield portions 36 and 37, respectively. One example is portion 10, as shown in FIG. 5, after an oxide etch and formation of salicide on the silicon exposed by the oxide etch. The oxide etch either does not remove all of the oxide from top 22 of gate 16 or is masked from etching the oxide on top 22 of gate 16. The oxide on top 22 of gate 16, which is shown as oxide 19 in FIG. 4, can be made to be thicker than oxide 15 which overlies regions 31 and 32. One known way of making this oxide thicker is to form a layer of oxide over the polysilicon before it is etched to form the polysilicon gate. This layer of oxide would be selectively etched with the same mask which is used to etch the polysilicon to form the gate. This would increase the complexity of the etch of the gate but this is a known technique. Thus, if oxide 19 is sufficiently thick, there will still be oxide left on top 22 of gate 16 after the oxide etch which removes the portions of oxide 15 which overlie regions 31 and 32 is performed. This oxide etch does remove all of the oxide from the tops of heavily-doped regions 31 and 32. There is then formed on the exposed silicon a salicide portion 41 over heavily-doped region 31 and a salicide portion 42 formed over heavily-doped region 32. Salicide portions 41 and 42 make electrical contact with polysilicon portions 36 and 37. This contact can be quite resistive and still provide the desired function of providing a path for electrons and/or holes to escape polysilicon portions 36 and 37 out the source and drain, respectively, so as to avoid accumulating electrons and/or holes in the shield portions.

Figure 6:
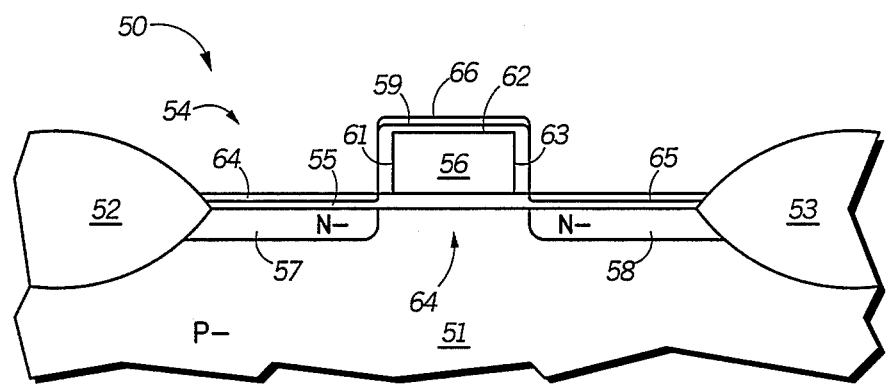
FIG. 6 is a cross-section of an alternative to that of FIG. 2 at a subsequent stage in processing to that shown in FIG. 1 according to an alternative preferred embodiment of the invention.

Another method for obtaining shields for the same purpose as shield portions 36 and 37 is to perform a heavy, shallow silicon implant on the oxide which is over the source and drain. The implant of silicon is sufficiently shallow and heavy that a silicon layer is formed near the surface of the implanted oxide. Such a layer can act as a "seed" for the selective growth of a film layer such as polysilicon. The selective deposition of polysilicon is then performed so that polysilicon is deposited on the oxide which is over the source and drain. The structure of portion 10 shown in FIG. 1 would be a convenient starting point. Shown in FIG. 6 is a portion 50 of an integrated circuit at a stage in processing after that which forms a structure like that of FIG. 1. Portion 50 is formed in a P— substrate 51 and comprises a field oxide region 52, a field oxide region 53, an active region 54 therebetween, an oxide layer 55 over active region 54, a polysilicon gate 56, a source region 57 which is lightly-doped to N—, a drain region 58 which is lightly doped to N—, and a reoxidation layer 59 coating polysilicon gate 56. The structure of portion 50 shown in FIG. 6 is formed by forming field oxide regions 52 and 53, growing oxide layer 55 in active region 54, forming a polysilicon layer over oxide layer 55 which is etched to form gate 56, implanting source and drain regions 57 and 58 to N—, and reoxidizing gate 56 to form reoxidation layer 59. Polysilicon gate has a left side 61, a top side 62, and a right side 63 which are coated by reoxidation layer 59. Polysilicon gate 56 is formed intermediate active region 54 so that source region 57 and drain region 58 are uncovered by the formation of gate 56. A channel region 64 is in substrate 51, under gate 56, and between source region 57 and drain region 58. Portion 50 shown in FIG. 6 could be a portion of a well in a CMOS process. In addition to the conventional features heretofore described for portion 50, oxide layer 55 is heavily and shallowly implanted with silicon to form an implanted region 64 in a top portion of oxide layer which overlies region 57 and an implanted region 65 in a top portion of oxide layer 55 which overlies region 58. Incidental to implanting portions of oxide layer 55, a top portion of reoxidation layer 59 also has formed therein an implanted region 66. The implant is sufficiently low energy and thus sufficiently shallow for there to be silicon near top surfaces of regions 64 and 65. Oxide layer 55 can be made to the thickness necessary to ensure that the low energy implant does not penetrate significantly to the source and drain regions 57 and 58.

Figure 7:
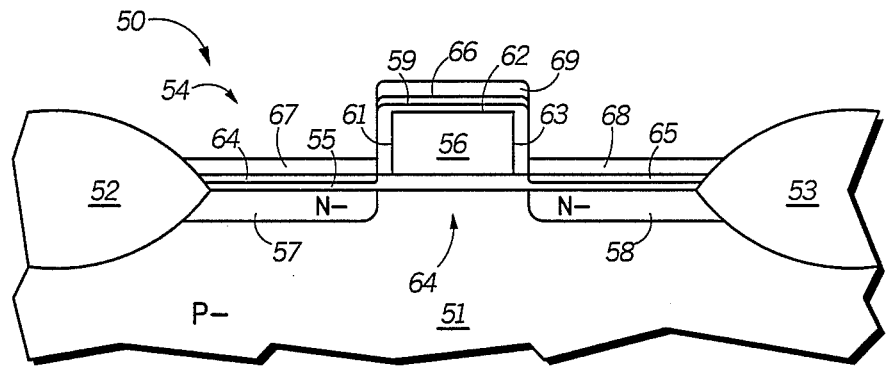
FIG. 7 is a cross-section of the portion of the integrated circuit of FIG. 6 at a stage in processing subsequent to that shown in FIG. 6 according to the alternative preferred embodiment of the invention.
Figure 8:
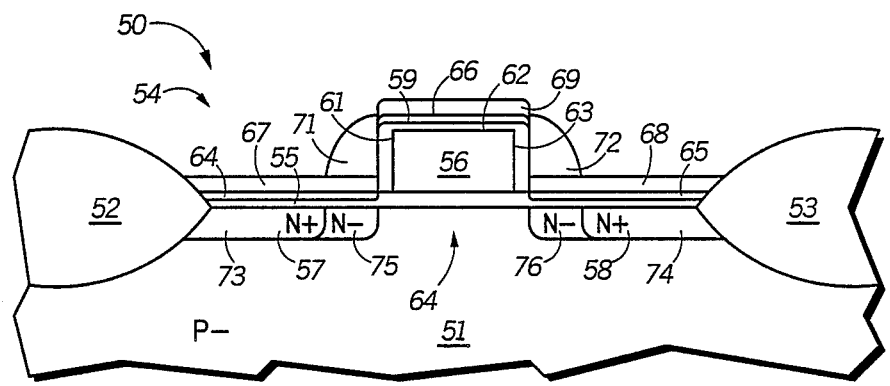
FIG. 8 is a cross-section of the portion of the integrated circuit of FIG. 8 at a stage in processing subsequent to that shown in FIG. 8 according to the alternative preferred embodiment of the invention.

After forming regions 64 and 65, which have silicon near the top surfaces thereof, a selective polysilicon deposition step is performed. The result of this step is shown in FIG. 7. Shown in FIG. 7 are polysilicon portions 67, 68, and 69 which result from the selective polysilicon deposition step. Portion 67 overlies implanted region 64. Portion 68 overlies implanted region 65, and portion 69 overlies implanted portion 66. After formation of portions 67–69 by selective deposition, sidewall spacers 71 and 72 are formed as shown in FIG. 8. Sidewall spacer 71 is adjacent to left side 61 of gate 56 and overlies a portion of region 57. Sidewall spacer 72 is adjacent to right side 63 of gate 56 and overlies a portion of region 58. Sidewall spacers 71 and 72 act as masks for an N+ implant. This N+ implant results in the formation of N+ regions 73 and 74 within regions 57 and 58, respectively. N— regions 75 and 76, which are under sidewall spacers 71 and 72, respectively, remain in regions 57 and 58, respectively. A polysilicon and oxide etch is then performed using sidewall spacers 71 and 72 as masks. The etch of polysilicon and oxide removes the portions of oxide 55, implanted region 65, and polysilicon portion 68 which are between field oxide 53 and sidewall spacer 72. Similarly, the etch of polysilicon and oxide removes the portions of oxide 55, implanted portion 64, and polysilicon portion 67 which are between sidewall spacer 71 and field oxide 52. Also removed are implant region 62, polysilicon portion 69, and the portion of reoxidation layer 59 which is on top side 62 of gate 56. After this etch there remains a portion 81 of selectively-deposited polysilicon portion 67 which underlies sidewall spacer 71. Similarly, there also remains a portion 82 of selectively-deposited polysilicon portion 68. Portions 81 and 82 act as shields as described for shield portions 36 and 37 in FIGS. 4 and 5. Salicide regions 77, 78, and 79 are then formed on exposed silicon surfaces above regions 73 and 74 and on top side 62 of gate 56, respectively. Salicide region 77 is formed to a sufficient thickness to contact shield portion 81 which thus establishes an electrical contact between shield portion 81 and region 73. Similarly, salicide region 78 is formed to a sufficient thickness to contact shield portion 82 and thus establish an electrical contact between region 78 and shield portion 82.

Figure 9:
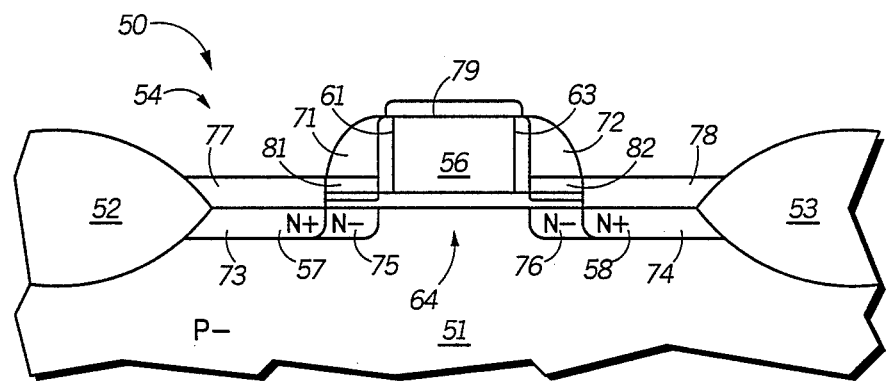
FIG. 9 is a cross-section of the portion of the integrated circuit of FIG. 8 at a stage in processing subsequent to that shown in FIG. 8 according to the alternative embodiment of the invention.

Portion 50 in FIG. 9 thus also has the shields for the desirable collection of hot carriers. The transistor of FIG. 9 also offers a performance advantage over that of FIG. 5. In FIG. 5, the shield portions have a vertical portion adjacent to the gate. This vertical portion increases the capacitance between the gate and the shield. Because each shield portion is connected to a source or drain, the gate-to-shield capacitance adds to the gate-to-drain capacitance and the gate-to-source capacitance. Shield portions 81 and 82 adjoin insulator layer 59 so there is some gate-to-shield capacitance also. Shield portions 81 and 82, however, do not have the vertical portion which is present with shield portions 36 and 37 so there is much less gate-to-shield capacitance for the transistor of FIG. 9. The transistor of FIG. 9 thus has less gate-to-drain capacitance and less gate-to-source capacitance.

Figure 10:
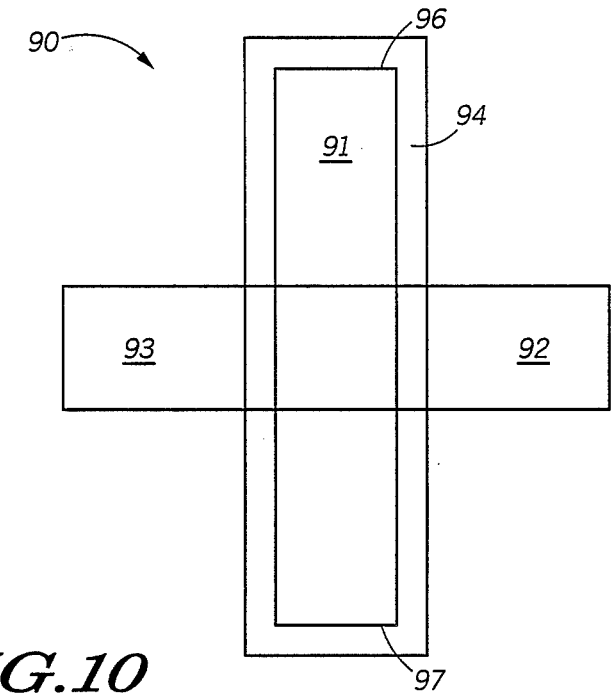
FIG. 10 is a simplied layout of a transistor according to either embodiment of the invention.
Figure 11:
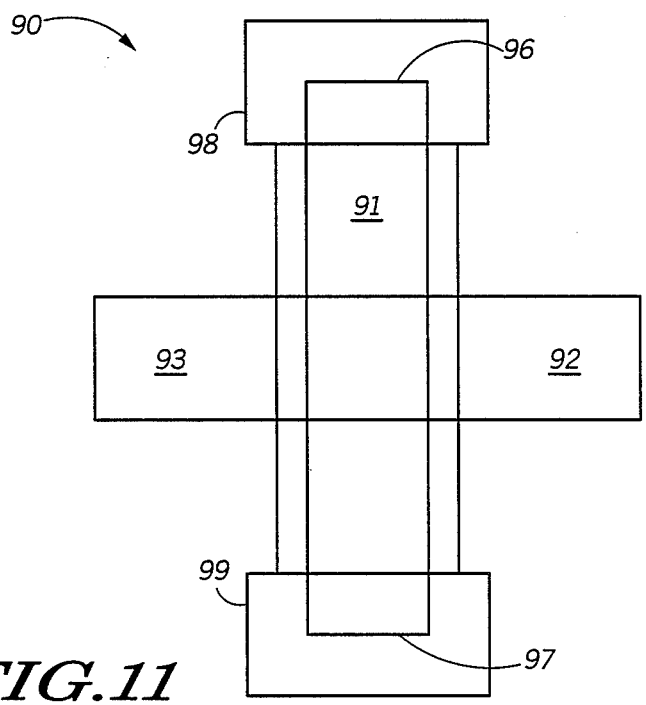
FIG. 11 is a simplied layout of the transistor of FIG. 10 at a stage in processing subsequent to that shown in FIG. 10.

Shown in FIG. 10 is a transistor 90 which can be made from either process described above comprising a polysilicon strip 91 for a gate, a drain 92, a source 93, and a shield 94. Shield 94 surrounds polysilicon strip 91 including end portions 96 and 97 of polysilicon strip 91. This is a problem because it is contemplated that a portion of shield 94 which is adjacent to drain 92 will contact drain 92 and a portion of shield 94 which is adjacent to source 93 will contact source 93. This will then have the effect of shorting the source and drain together. This is overcome by a mask and subsequent etch. After a masking layer has been applied and patterned, an aperture 98 is opened to expose end portion 96 and an aperture 99 is opened to expose end portion 97 as shown in FIG. 11. An etch is then performed which removes the portions of shield 94 which are adjacent to end portions 96 and 97. The result, shown in FIG. 11, avoids the problem of shorting the source and drain via the shield. Although the etch is shown as being performed after the conductive layer which forms the shield has been etched, this etch can be performed at another convenient point after the shield layer has been deposited but before it is etched to form the shields.

While the invention has been described in specific embodiments, it will be apparent to those skilled in the art that the disclosed invention may be modified in numerous ways and may assume many embodiments other than those specifically set out and described above. For example, the invention is applicable to P channel transistors. Implants of impurities to form N-type regions could be substituted with impurities to form P-type regions. Also the sequence of steps could be changed. One such example is that the implant to form regions 73 and 74 shown in FIG. 8 could occur after the removal of portions of deposited polysilicon portions 67 and 68. Another example is that the shield portions may be electrical contacted with some signal or reference other than sources and drains of the respective transistors. Accordingly, it is intended by the appended claims to cover all modifications of the invention which fall within the true spirit and scope of the invention.

I claim:

1. A transistor formed in an active region of a substrate, comprising:
 a first insulator layer on the active region;
 a gate overlying the first insulator layer at an intermediate portion of the active region leaving a first portion and a second portion of the active region uncovered by the gate, said gate having a first side and a second side, said first and second sides aligned with said first and second portions, respectively, of the active region;
 a second insulator layer coating the first and second sides of the gate;
 a lightly-doped source region in the first portion of the active region and aligned substantially with the first side of the polysilicon gate;
 a lightly-doped drain region in the second portion of the active region aligned substantially with the second side of the polysilicon gate;
 a channel region in the active region, under the gate, and between the lightly-doped source region and the lightly-doped drain region;
 a first heavily-doped region in the first portion of the active region, offset from the first side of the polysilicon gate, and adjoining the lightly-doped source region;
 a second heavily-doped region in the second portion of the active region, offset from the second side of the polysilicon gate, and adjoining the lightly-doped drain region;
 a first conductive strip adjoining the second insulator layer on the first side of the gate, over at least a portion of the lightly-doped source region, and separated from the lightly-doped source region by the first insulator layer; and
 a second conductive strip adjoining the second insulator layer on the second side of the gate, over at least a portion of the lightly-doped drain region, and separated from the lightly-doped drain region;
 a first conductive layer over the source region and in contact with the first conductive strip and the source region; and
 a second conductive layer over the drain region and in contact with the first conductive strip and the drain region.

2. The transistor of claim 1 wherein the first insulator layer is further characterized as being oxide with silicon impregnated portions on the surface thereof and in contact with the first conductive layer and the second conductive layer.

3. The transistor of claim 1 wherein the first and second conductive strips are polysilicon.

4. The transistor of claim 1 wherein the first conductive strip is characterized has having a vertical portion adjoining the second insulator layer and a horizontal portion adjoining the first insulator layer.

5. The transistor of claim 1 wherein the gate has a thickness measured along the first side thereof and the first conductive strip has a horizontal dimension along the first insulator layer and a vertical dimension along the first side of the gate, said vertical dimension being substantially less than the thickness of the gate and substantially less than the horizontal dimension.

6. The transistor of claim 1 wherein the first conductive strip is characterized as being a layer parallel with the surface of the substrate and of uniform thickness.

7. A transistor formed in an active region of a substrate, comprising:
 a first insulator layer on a portion of the active region;
 a gate overlying the first insulator layer at an intermediate portion of the active region leaving a first portion and a second portion of the active region uncovered by the gate, said gate having a first side and a second side, said first and second sides aligned with said first and second portions, respectively, of the active region;
 a second insulator layer coating the first and second sides of the gate;
 a lightly-doped source region in the first portion of the active region and aligned substantially with the first side of the polysilicon gate;
 a lightly-doped drain region in the second portion of the active region aligned substantially with the second side of the polysilicon gate;
 a channel region in the active region, under the gate, and between the lightly-doped source region and the lightly-doped drain region;
 a first heavily-doped region in the first portion of the active region, offset from the first side of the polysilicon gate, and adjoining the lightly-doped source region;
 a second heavily-doped region in the second portion of the active region, offset from the second side of the polysilicon gate, and adjoining the lightly-doped drain region;
 a first conductive strip adjoining the insulator coating on the first side of the gate and over at least a portion of the lightly-doped source;
 a first insulating portion under the first conductive strip;
 a second conductive strip adjoining the insulator coating on the second side of the gate and over at least a portion of the lightly-doped source;
 a second insulating portion under the second conductive strip;
 an electrical contact between the first conductive strip and the first heavily-doped region; and
 an electrical contact between the second conductive strip and the second heavily-doped region.

8. The transistor of claim 7 wherein the first conductive strip is formed by the steps of:
 implanting silicon onto the first insulating portion; and
 performing selective deposition of polysilicon to form the first conductive strip.

9. The transistor of claim 7 wherein the first and second conductive strips are formed by the steps of:
 depositing polysilicon over at least the first and second lightly-doped regions, the first and second heavily-doped regions, and the gate;
 forming a first sidewall spacer on a first portion of the polysilicon, said first sidewall spacer overlying the first lightly-doped region and leaving the first heavily-doped region uncovered by the first sidewall spacer, and located beside the first side of the gate and separated therefrom by the second insulating layer;

forming a second sidewall spacer on a second portion of the polysilicon, said second sidewall spacer overlying the second lightly-doped region and leaving the second heavily-doped region uncovered by the first sidewall spacer, and located beside the first side of the gate and separated therefrom by the second insulating layer; and etching the polysilicon over the gate and the first and second heavily-doped regions using the first and second sidewall spacers as masks.

10. The transistor of claim 7 wherein the first insulator layer is further characterized as being oxide with silicon impregnated portions on the surface thereof and in contact with the first conductive layer and the second conductive layer.

11. The transistor of claim 7 wherein the first and second conductive strips are polysilicon.

12. The transistor of claim 7 wherein the first conductive strip is characterized has having a vertical portion adjoining the second insulator layer and a horizontal portion adjoining the first insulator layer.

13. The transistor of claim 7 wherein the gate has a thickness measured along the first side thereof and the first conductive strip has a horizontal dimension along the first insulator layer and a vertical dimension along the first side of the gate, said vertical dimension being substantially less than the thickness of the gate and substantially less than the horizontal dimension.

14. The transistor of claim 7 wherein the first conductive strip is characterized as being a conductive layer parallel with the surface of the substrate and of uniform thickness.

* * * * *